(12) United States Patent
Abroy

(10) Patent No.: US 9,397,235 B2
(45) Date of Patent: Jul. 19, 2016

(54) PHOTOVOLTAIC STRING COMBINER WITH DISCONNECT HAVING PROVISION FOR CONVERTING BETWEEN GROUNDED AND UNGROUNDED SYSTEMS

(75) Inventor: Hamid Sattari Abroy, Lexington, KY (US)

(73) Assignee: SCHNEIDER ELELCTRIC USA, INC., Schaumburg, IL (US)

( * ) Notice: Subject to any disclaimer, the term of this patent is extended or adjusted under 35 U.S.C. 154(b) by 890 days.

(21) Appl. No.: 13/309,657

(22) Filed: Dec. 2, 2011

(65) Prior Publication Data

US 2013/0139384 A1 Jun. 6, 2013

(51) Int. Cl.
| H05K 13/00 | (2006.01) |
| H01L 31/02 | (2006.01) |
| H01L 31/05 | (2014.01) |
| H02S 40/36 | (2014.01) |

(52) U.S. Cl.
CPC .......... *H01L 31/02021* (2013.01); *H01L 31/05* (2013.01); *H02S 40/36* (2014.12); *Y02E 10/50* (2013.01); *Y10T 29/49169* (2015.01); *Y10T 29/49174* (2015.01); *Y10T 307/724* (2015.04)

(58) Field of Classification Search
CPC .................................................. H05K 13/00
USPC ........................................................ 307/85
See application file for complete search history.

(56) References Cited

U.S. PATENT DOCUMENTS

| 8,450,944 | B2 * | 5/2013 | Joseph | ............... H05B 37/0263 315/209 R |
| 2003/0111103 | A1 * | 6/2003 | Bower | .................... H02S 20/23 136/244 |
| 2010/0326809 | A1 * | 12/2010 | Lang | ................. H01L 31/02021 200/5 B |
| 2013/0050906 | A1 * | 2/2013 | Peplinski | ................. H02B 1/32 361/622 |

FOREIGN PATENT DOCUMENTS

| DE | 202007002077 | 4/2008 | ............... H02H 3/24 |
| DE | 102008008505 | * 8/2009 | |
| DE | 102010037760 | 3/2011 | ............... H02N 6/00 |
| EP | 2037537 | 3/2009 | ............... H01R 9/24 |
| EP | 2061052 | 5/2009 | ............. H01H 33/59 |
| EP | 2256822 | 12/2010 | ............. H01L 31/02 |
| FR | 2427679 | 12/1979 | ............. H01H 71/08 |
| WO | 2006/078685 | 7/2006 | ............ H01L 31/042 |
| WO | 2007/101682 | 9/2007 | ............. H01H 37/76 |

OTHER PUBLICATIONS

International Search Report mailed Mar. 5, 2013 issued in corresponding International Patent Application No. PCT/US2012/065432 (5 pages).

Written Opinion mailed Mar. 5, 2013 issued in corresponding International Patent Application No. PCT/US2012/065432 (6 pages).

* cited by examiner

*Primary Examiner* — Rexford Barnie
*Assistant Examiner* — Daniel Kessie
(74) *Attorney, Agent, or Firm* — Locke Lord LLP

(57) ABSTRACT

A string combiner is provided for coupling multiple strings of series-connected photovoltaic (PV) panels in a PV array to downstream equipment, each string including positive and negative conductors. The combiner includes a combiner box containing a busbar connected to the protection devices for receiving and combining the currents from the multiple strings of PV panels, output terminals for connection to the downstream equipment, and a disconnect device within the combiner box and including a multi-pole switch connected to the busbar for disconnecting the downstream equipment from the multiple strings. A plurality of connectors are provided for connecting selected poles of the multi-pole switch to each other or to selected ones of the output terminals in either a grounded or an ungrounded configuration.

18 Claims, 2 Drawing Sheets

PHOTOVOLTAIC STRING COMBINER WITH DISCONNECT HAVING PROVISION FOR CONVERTING BETWEEN GROUNDED AND UNGROUNDED SYSTEMS

FIELD OF THE INVENTION

The present invention relates generally to solar photovoltaic (PV) combiners, and, more particularly, to such combiners that include a disconnect adapted for conversion between grounded and ungrounded PV systems.

BACKGROUND OF THE INVENTION

A solar photovoltaic (PV) array is a parallel arrangement of strings of series-connected PV panels. A string in the context of PV arrays, often referred to simply as a "PV string," is an arrangement of PV panels connected together in series to produce a voltage at a desired level for a downstream DC-to-AC inverter. As will be appreciated, solar PV arrays can occupy extensive surface areas. A typical PV system might contain multiple PV arrays and dozens or even hundreds of PV panels.

A PV array is composed of multiple strings of PV panels. Each string output is received in a device called a combiner, which "combines" the currents from multiple strings into a larger conductor, called a busbar, for feeding downstream equipment and ultimately to a DC-to-AC inverter that converts the DC currents produced by the strings of PV panels into an AC current. The combiner can receive strings from multiple PV arrays.

In the combiner, which typically takes the form of an enclosure referred to as a "string combiner box," protection devices such as circuit breakers or fuses are used to limit backfeeding current from one or more strings into another string. Backfeeding current into a PV panel can damage the wiring panel or otherwise adversely affect the performance of the PV array.

Both grounded and ungrounded PV systems are in widespread use. Even in the United States, where grounded electrical power distribution systems have historically been required, ungrounded PV systems are now permitted, provided a DC disconnect is provided for ungrounded conductors.

SUMMARY OF THE INVENTION

In one embodiment, the present invention provides a string combiner box that includes a multi-pole DC disconnect that can be easily and quickly converted from a grounded configuration to an ungrounded configuration, or vice versa. Both configurations couple multiple PV strings to downstream equipment, such as a DC-to-AC converter or other combiners. In one implementation, the combiner box contains a busbar coupled to the positive conductors of the multiple PV strings for receiving and combining the currents from the multiple PV strings, and a pair of output terminals for connection to the downstream equipment.

A disconnect device within the combiner box includes a multi-pole switch connected to the busbar for disconnecting the multiple PV strings from the downstream equipment. The connections between the multiple poles of the switch and selected ones of the output terminals of the combiner box are adapted to be easily and quickly configured for either grounded or ungrounded systems.

In one example, the disconnect device includes a multi-pole switch that can be connected to the busbar and at least one of the output terminals in either (1) a grounded configuration in which the multiple poles are connected in series between the positive busbar and one of the output terminals, or (2) an ungrounded configuration in which first and second poles are connected between the positive busbar and one of the output terminals, and a third pole is connected in series between the negative conductors of the multiple PV strings and the other output terminal. For example, the third pole may be connected in series with the first and second pole, for the grounded configuration, or to the negative conductors of the multiple PV strings, for the ungrounded configuration.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
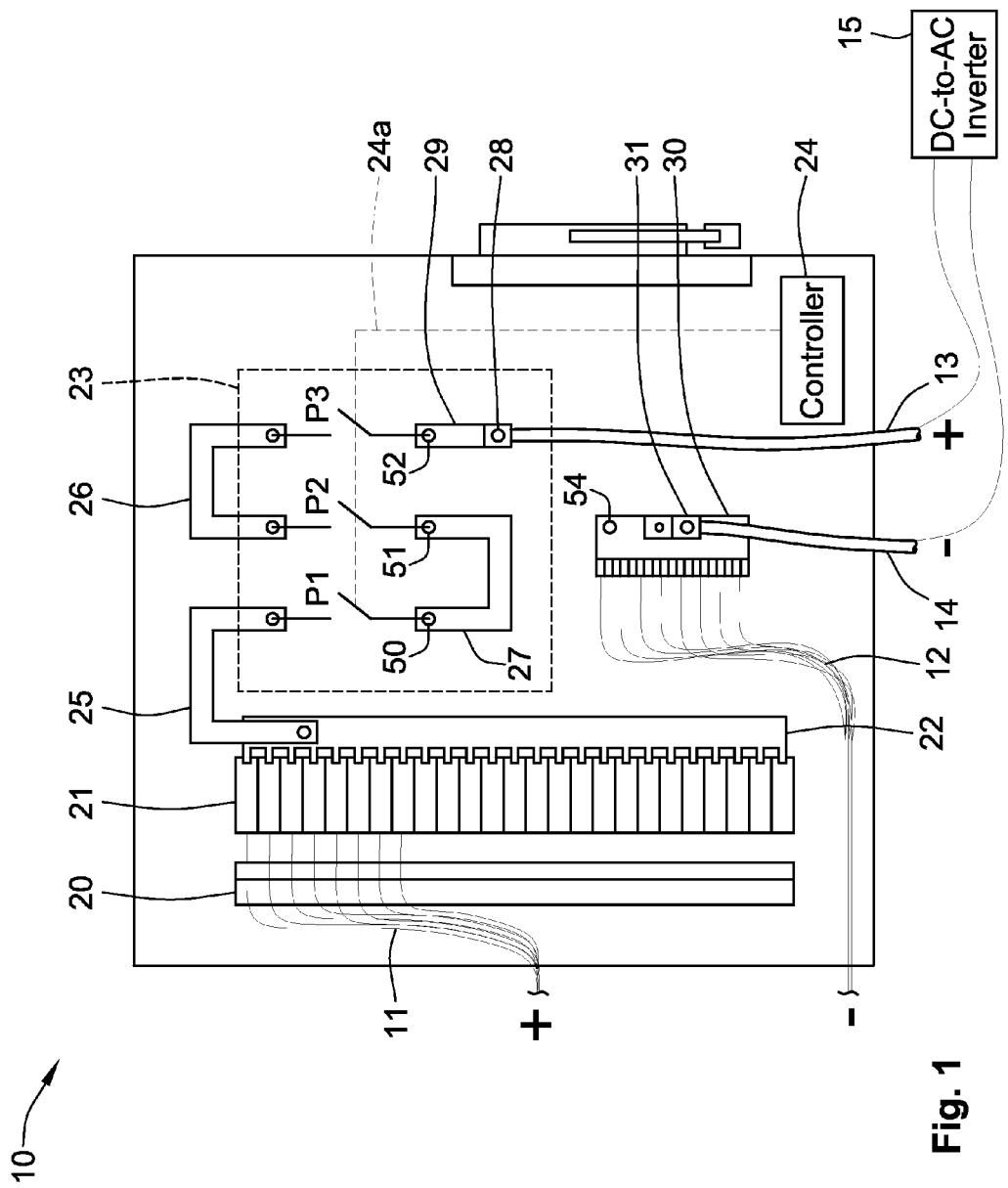
FIG. 1 is a diagrammatic plan view of a string combiner box configured for a grounded system.

Turning now to the drawings and referring first to FIG. 1, a string combiner box 10 is connected to multiple pairs of positive conductors 11 and negative conductors 12 from multiple PV strings, i.e., strings of series-connected PV panels. Each PV panel conventionally includes an array of PV cells, which convert solar or other light energy into a corresponding DC current, which can be stored in a battery or other storage device and/or used to power DC or AC electrical loads. The combiner box 10 has an enclosure, such as a metal housing, that houses and protects components within the box, such as against physical intrusion and the environment. A PV combiner receives multiple individual feeds of DC current from multiple PV strings and "combines" all of those DC currents onto a single pair of output conductors 13 and 14. The conductors 13 and 14 are typically connected to a downstream DC-to-AC inverter 15, or to a downstream combiner which combines DC current outputs from multiple first-level combiners that receive DC current directly from multiple PV strings. PV panels and combiners can be arranged in a hierarchical structure, with sets of panels feeding into first-level combiners and groups of first-level combiners feeding into one or more downstream combiners, which ultimately feed into a DC-to-AC inverter. Collectively, the strings of PV panels make up a PV array, and the combiner can receive strings from one or more than one PV array.

Inside the combiner box 10, each individual positive conductor 10 of the PV strings is threaded through a separate aperture of a guide rail 20 and connected to the input terminal of a protection device 21, such as a circuit breaker or fuse. The protection devices 21 open the respective circuits automatically in response to fault conditions such as a line-to-ground fault or an overcurrent or short-circuit. As depicted in FIG. 1, multiple protection devices 21 are provided in the combiner box 10 so that the positive conductor of each PV string can be connected to a separate protection device 21. On the output side, the output terminals of all the protection devices 21 are connected to a common busbar 22, so that all of the individual DC currents from the multiple PV strings are summed to produce a single composite DC current in the busbar 22. From the positive busbar 22, the composite DC current is fed into a disconnect device 23, which provides a single safety shutoff for interrupting the flow of current between all the PV strings and the downstream equipment connected to the combiner output conductors 13 and 14.

In the illustrative embodiment of FIG. 1, the disconnect device 23 is a controllable switch having three poles P1, P2 and P3 that are operated in unison by a controller 24, which may include circuitry that receives input signals from a variety of different sensors and/or a manually controlled input. The controller 24 produces an output 24a that controls the opening and closing of the three poles P1-P3, which in turn open and close the circuit between the multiple PV strings and the downstream equipment.

The positive busbar 22 is connected to the first pole P1 of the disconnect switch 23 by a first U-shaped connector 25, and a second U-shaped connector 26 connects poles P2 and P3. Thus, the three poles P1-P3 are all connected in series with each other and the busbar 22. In the illustrated embodiment, the two connectors 25 and 26 remain the same for both grounded and ungrounded configurations of the combiner box, and only the connections between the three poles P1-P3 and the output terminals need to be changed to convert from a grounded configuration to an ungrounded configuration. The two different configurations are shown in FIG. 1 (grounded) and FIG. 2 (ungrounded).

In the grounded configuration of FIG. 1, the two poles P1 and P2 are connected in series by the first U-shaped connector 25 and a third U-shaped connector 27, and the third pole P3 is connected to an output terminal 28 by a first straight connector 29 attached to a post 52 that is part of the pole P3. The output terminal 28 in turn is connected to the positive output conductor 13 of the combiner box. Thus, it can be seen that the three poles P1-P3 are all connected in series to open and close the circuit between the positive busbar 22 and the output conductor 13 of the combiner box.

In the grounded configuration, the negative conductors 12 of the multiple PV strings are not connected to the disconnect device 23, but rather are connected directly to a negative input terminal block 30 that has multiple sockets so that each negative conductor 12 from the multiple PV strings is received in a separate socket and secured by a screw or clip. A lug 31 on the terminal block 30 connects the negative output conductor 14 of the combiner box 10 to the terminal block 30. Thus, when the disconnect switch 23 is actuated, the negative conductor circuit through the combiner box remains closed, while the positive conductor circuit through the combiner box 10 is opened or closed by all three poles P1-P3 opening or closing in unison.

Figure 2:
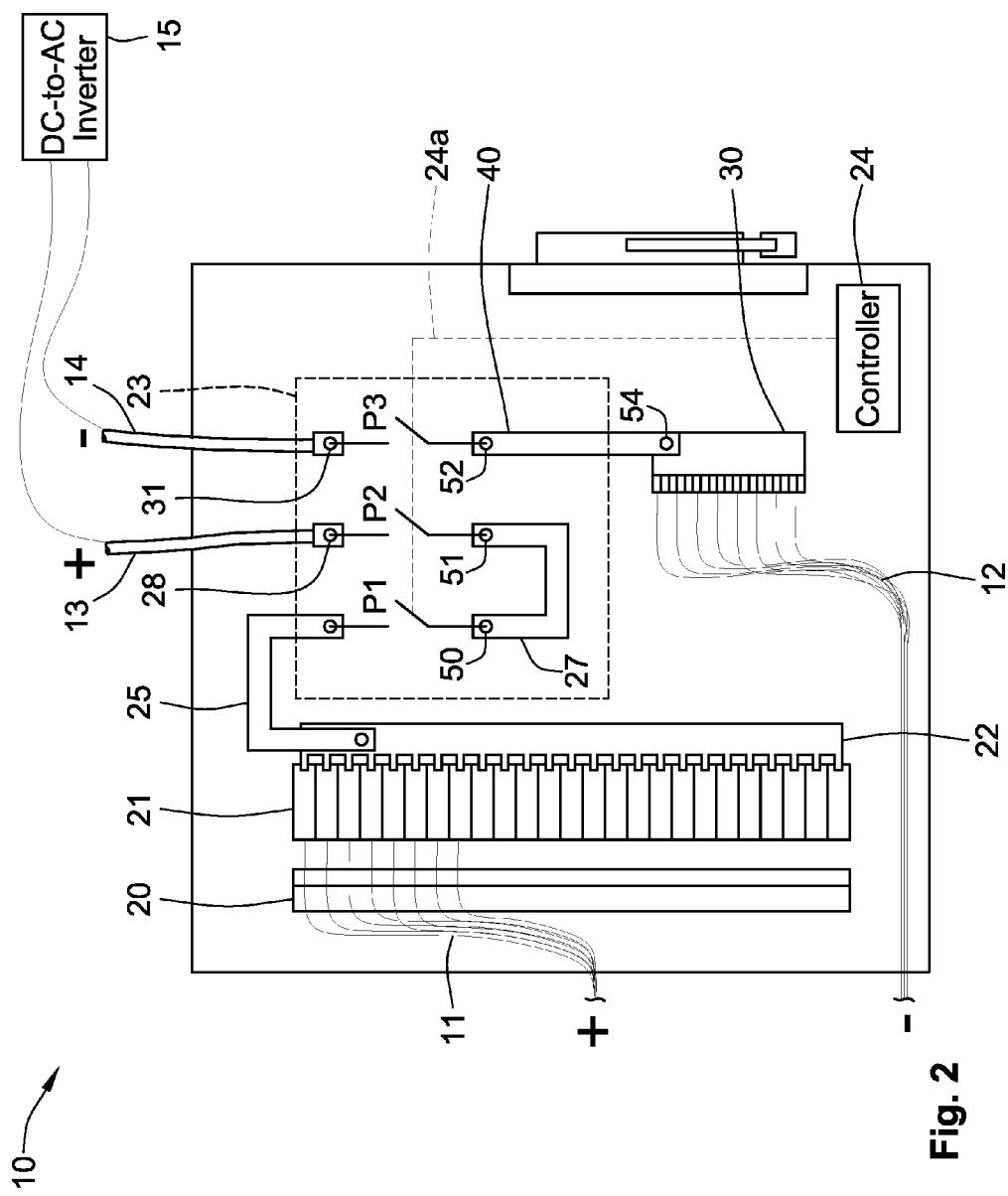
FIG. 2 is a diagrammatic plan view of the string combiner box of FIG. 1 reconfigured for an ungrounded system.

Turning next to the ungrounded configuration shown in FIG. 2, everything is the same as in FIG. 1 except the connections to the output sides of the poles P2 and P3, which are changed so that (1) the positive and negative conductor circuits both pass through the disconnect switch 23, (2) the output conductors 13 and 14 are connected to the upper ends of the poles P2 and P3, which become the output sides of these two poles, and (3) the terminal block 30 is moved into alignment with the pole P2 rather than pole P3. Specifically, the first straight connector 29 in the configuration of FIG. 1 is replaced with a second, longer straight connector 40, and the second U-shaped connector 26 is replaced with the lugs 28 and 31. The second straight connector 40 connects the post 52 on the lower end of the pole P3 to the terminal block 30, and the lugs 28 and 31 are connected to the positive and negative output conductors 13 and 14, respectively. Thus, the positive conductor 13 is now connected to the busbar 22 via the first U-shaped connector 25, the poles P1 and P2 (which are still connected in series by the third U-shaped connector 27), and the lug 28. The negative output conductor 14 is connected to the terminal block 30 via the second straight connector 40, the pole P3, and the lug 31. Thus, when the disconnect switch 23 is actuated, the poles P1 and P2 open or close the positive conductor circuit through the combiner box 10, and the pole P3 opens or closes the negative conductor circuit through the combiner box 10.

The changes described above permit the same combiner box to be used with both grounded and ungrounded systems while complying with the requirements of the National Electric Code (NEC) for both types of systems. The NEC is controlled by the National Fire Protection Association, Inc. and is generally controlling in the United States. The NEC requires that a grounded conductor, such as the negative conductor in a grounded configuration, must not be switched by a disconnect. Conversely, the NEC requires that both the positive and negative conductors must be switched by a disconnect in an ungrounded system, since both those conductors are ungrounded.

By comparing FIGS. 1 and 2, it can be seen that the upper ends of the poles P2 and P3 are connected to the second U-shaped connector 26 in the grounded configuration of FIG. 1, whereas in the ungrounded configuration of FIG. 2 the upper ends of the poles P2 and P3 are connected to the positive and negative output conductors 13 and 14 via the lugs 28 and 31, which are simply moved to different locations in the ungrounded configuration. The lower end of the second straight connector 40 is connected to the terminal block 30 by a post 54 that is built into that terminal block 30. Thus, the only different part needed to convert the grounded configuration to the ungrounded configuration is the second straight connector 40. This extra part is furnished in a kit along with all the parts used in the grounded configuration of FIG. 1. In one embodiment of the kit, the combiner box is pre-assembled in the grounded configuration of FIG. 1, and the kit contains that pre-assembled combiner box plus the second straight connector 40. In an alternative embodiment, the kit may contain a combiner box pre-assembled in the ungrounded configuration of FIG. 2 plus the third U-shaped connector 26. A third embodiment of the kit contains all the unassembled parts for both configurations.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A string combiner for coupling multiple strings of series-connected photovoltaic (PV) panels in a PV array to downstream equipment, each of said strings of PV panels including positive and negative conductors, said string combiner comprising
a combiner box containing
a busbar coupled to the positive conductors of said multiple strings of PV panels for receiving and combining the currents from said multiple strings,
output terminals for connection to said downstream equipment,
a disconnect device within said combiner box and including a multi-pole switch connected to said busbar for disconnecting said downstream equipment from said multiple strings, and
a plurality of connectors for connecting selected poles of said multi-pole switch to each other in one of a plurality of available configurations including a grounded configuration and an ungrounded configuration or to selected ones of said output terminals in one of the plurality of available configurations including the grounded configuration and the ungrounded configuration,
wherein the plurality of connectors are selected from a kit set of connectors that include different types of connectors which are connectable in the combiner box to selected poles of said multi-pole switch or to selected ones of said output terminals, one or more of the plurality of connectors being replaceable with one or more other connectors from the set of connectors to change connections in the combiner box from one of the grounded and ungrounded configurations to the other of the grounded and ungrounded configurations,
wherein the plurality of connectors is one of a first subset of connectors selected from the set of connectors for assembly into the grounded configuration and a different second subset of connectors selected from the set of connectors for assembly into the grounded configuration, the first and second subsets including one or more of the same type of connectors,
wherein the multi-pole switch is a three-pole switch, the first subset of connectors consists essentially of three U-shaped connectors and a first straight connector, and the second subset of connectors consists essentially of two U-shaped connectors and a second straight connector which is longer than the first straight connector.

2. The string combiner of claim 1 in which said connectors are adapted to connect one of the poles of said multi-pole switch either in series with the other poles of said multi-pole switch for said grounded configuration, or to said negative conductors from said multiple strings for said ungrounded configuration.

3. The string combiner of claim 1 which includes a terminal block connected to the negative conductors of said multiple strings of PV panels.

4. The string combiner of claim 3 in which said terminal block also forms one of said output terminals in said grounded configuration.

5. The string combiner of claim 1 in which said downstream equipment includes a DC-to-AC inverter.

6. The string combiner of claim 1 which includes a plurality of protection devices connecting the positive conductors of said multiple strings of PV panels to said busbar.

7. The string combiner of claim 6 in which said protection devices are fuses or circuit breakers.

8. The string combiner of claim 1, wherein the poles of the disconnect switch and the output terminals of the combiner box include posts on which to replaceably connect selected connectors from the set of connectors.

9. The string combiner of claim 1, wherein the plurality of connectors are pre-assembled in the combiner box in one of the grounded and ungrounded configurations.

10. A method of coupling multiple strings of series-connected photovoltaic (PV) panels in a PV array to downstream equipment via a string combiner box, each of said strings including positive and negative conductors, and said combiner box containing a busbar coupled to said positive conductors for combining the currents from said multiple strings, output terminals for connecting said combiner box to said downstream equipment, and a disconnect device that includes a multi-pole switch, said method comprising
coupling said multiple strings to said busbar,
connecting said multi-pole switch in one of a plurality of available configurations including
a grounded configuration in which the multiple poles are connected in series between said busbar and one of said output terminals, and
an ungrounded configuration in which a third pole of said switch is connected between the negative conductors of said multiple strings and one of said output terminals, and second and first poles of said switch are connected in series between said busbar and the other of said output terminals,
providing a plurality of connectors adapted to connect one of the poles of said multi-pole switch either in series with the other poles of said multi-pole switch for said grounded configuration, or to said negative conductors from said multiple strings for said ungrounded configuration,
wherein the plurality of connectors are selected from a set of connectors that include different types of connectors which are connectable in the combiner box to selected poles of said multi-pole switch or to selected ones of said output terminals, one or more of the plurality of connectors being replaceable with one or more other connectors from the set of connectors to change connections in the combiner box from one of the grounded and ungrounded configurations to the other of the grounded and ungrounded configurations,
wherein the plurality of connectors is one of a first subset of connectors selected from the set of connectors for assembly into the grounded configuration and a different second subset of connectors selected from the set of connectors for assembly into the grounded configuration, the first and second subsets including one or more of the same type of connectors,
wherein the multi-pole switch is a three-pole switch, the first subset of connectors consists essentially of three U-shaped connectors and a first straight connector, and the second subset of connectors consists essentially of two U-shaped connectors and a second straight connector which is longer than the first straight connector.

11. The method of claim 10 including providing the combiner box with a terminal block connected to the negative conductors of said multiple strings of PV panels.

12. The method of claim 11 in which said terminal block also forms one of said output terminals in said grounded configuration.

13. The method of claim 10 in which said downstream equipment is a DC-to-AC inverter.

14. The method of claim 10 including providing a plurality of protection devices connecting said strings of PV panels to said busbar.

15. The method of claim 14 in which said protection devices are fuses or circuit breakers.

16. A string combiner kit for use in coupling multiple strings of series-connected photovoltaic (PV) panels in a PV array to downstream equipment, said kit comprising
a combiner box containing
a plurality of protection devices for connecting the box to the positive conductors of said multiple strings,
a busbar connected to said protection devices for receiving and combining the currents from said multiple strings,
output terminals for connection to said downstream equipment, and
a disconnect device within said combiner box and including a multi-pole switch connected to said busbar for disconnecting said downstream equipment from said multiple strings, and
a plurality of connectors for connecting selected ones of the poles of said multi-pole switch to each other in one of a plurality of available configurations including a grounded configuration and an ungrounded configuration or to selected ones of said output terminals in one of the plurality of available configurations including the grounded configuration and the ungrounded configuration,
wherein the plurality of connectors are selected from a set of connectors that include different types of connectors which are connectable in the combiner box to selected poles of said multi-pole switch or to selected ones of said output terminals, one or more of the plurality of connectors being replaceable with one or more other connectors from the set of connectors to change connections in the combiner box from one of the grounded and ungrounded configurations to the other of the grounded and ungrounded configurations,
wherein the plurality of connectors is one of a first subset of connectors selected from the set of connectors for assembly into the grounded configuration and a different second subset of connectors selected from the set of connectors for assembly into the grounded configuration, the first and second subsets including one or more of the same type of connectors,
wherein the multi-pole switch is a three-pole switch, the first subset of connectors consists essentially of three U-shaped connectors and a first straight connector, and the second subset of connectors consists essentially of two U-shaped connectors and a second straight connector which is longer than the first straight connector.

17. A string combiner kit for use in coupling multiple strings of series-connected photovoltaic (PV) panels in a PV array to downstream equipment, said kit comprising
a combiner box containing
a plurality of protection devices for connecting the box to the positive conductors of said multiple strings,
a busbar connected to said protection devices for receiving and combining the currents from said multiple strings,
output terminals for connection to said downstream equipment, and
a disconnect device within said combiner box and including a multi-pole switch connected to said busbar for disconnecting said downstream equipment from said multiple strings, and
a plurality of connectors for connecting selected ones of the poles of said multi-pole switch to each other in one of a plurality of available configurations including a grounded configuration and an ungrounded configuration or to selected ones of said output terminals in one of the plurality of available configurations including the grounded configuration and the ungrounded configuration,
wherein said protection devices, busbar, output terminals, disconnect device and selected ones of said connectors are pre-assembled in said combiner box in a selected one of said grounded and ungrounded configurations, and at least one connector not included in said selected configuration is included in said kit for use in converting said combiner box to the other of said configurations,
wherein the plurality of connectors is one of a first subset of connectors selected from a set of connectors for assembly into the grounded configuration and a different second subset of connectors selected from the set of connectors for assembly into the grounded configuration, the first and second subsets including one or more of the same type of connectors,
wherein the multi-pole switch is a three-pole switch, the first subset of connectors consists essentially of three U-shaped connectors and a first straight connector, and the second subset of connectors consists essentially of two U-shaped connectors and a second straight connector which is longer than the first straight connector.

18. The string combiner kit of claim 16 in which said connectors are adapted to connect said multiple poles and said output terminals in either
a grounded configuration in which said multiple poles are connected in series between said busbar and one of said output terminals, or
an ungrounded configuration in which first and second poles are connected between said busbar and one of said output terminals, and a third pole is connected between the negative conductors of said multiple strings and the other of said output terminals.

* * * * *